United States Patent
Kaneko

(10) Patent No.: US 12,362,522 B2
(45) Date of Patent: Jul. 15, 2025

(54) SOCKET

(71) Applicant: Enplas Corporation, Saitama (JP)

(72) Inventor: Ryuichi Kaneko, Kawaguchi (JP)

(73) Assignee: Enplas Corporation, Saitama (JP)

( * ) Notice: Subject to any disclaimer, the term of this patent is extended or adjusted under 35 U.S.C. 154(b) by 424 days.

(21) Appl. No.: 17/875,528

(22) Filed: Jul. 28, 2022

(65) Prior Publication Data

US 2024/0039217 A1 Feb. 1, 2024

(51) Int. Cl.
| | |
|---|---|
| *H01R 13/00* | (2006.01) |
| *G01R 1/04* | (2006.01) |
| *H01R 13/502* | (2006.01) |
| *H01R 13/6588* | (2011.01) |
| *H01R 12/70* | (2011.01) |
| *H01R 12/71* | (2011.01) |
| *H01R 13/24* | (2006.01) |

(52) U.S. Cl.
CPC ....... *H01R 13/6588* (2013.01); *G01R 1/0466* (2013.01); *H01R 13/502* (2013.01); *H01R 12/7082* (2013.01); *H01R 12/714* (2013.01); *H01R 13/2485* (2013.01); *H01R 2201/20* (2013.01)

(58) Field of Classification Search
CPC ............ H01R 13/6588; H01R 12/7082; H01R 12/714; H01R 13/2485; H01R 13/502; H01R 2201/20
See application file for complete search history.

(56) References Cited

U.S. PATENT DOCUMENTS

| | | | |
|---|---|---|---|
| 6,808,398 B2 * | 10/2004 | Fan | H01R 12/716 439/79 |
| 7,850,489 B1 * | 12/2010 | Feldman | H01R 13/518 439/607.1 |
| 11,954,845 B2 * | 4/2024 | Schertler | G06T 5/00 |
| 2004/0121631 A1 * | 6/2004 | Fan | H01R 12/716 439/79 |
| 2013/0203298 A1 | 8/2013 | Zhou et al. | |

FOREIGN PATENT DOCUMENTS

JP 2015-507198 3/2015

* cited by examiner

*Primary Examiner* — Phuong Chi Thi Nguyen

(57) ABSTRACT

A socket includes: a support in which a first electrical component is disposed on a top side of the support and a second electrical component is disposed on a bottom side thereof; and a signal pin held by the support and electrically connecting to the second electrical component and the first electrical component, wherein the support includes: a body made of a metal, the body holding the signal pin and being connected to a ground; a top plate portion having insulation, the top plate portion being provided above the body and including a top-side first through hole in which a top edge of the signal pin is disposed and a top-side second through hole provided around the top-side first through hole; and a conductive portion formed on an inner peripheral surface of the top-side second through hole and electrically connected to the body when in use.

4 Claims, 4 Drawing Sheets

SOCKET

TECHNICAL FIELD

The present invention relates to a socket that is for an electrical component and electrically connected to an electrical component such as a semiconductor device (e.g., Integrated Circuit (IC) package).

BACKGROUND ART

An electrical connection socket for relaying transmission and reception of an electrical signal between an electrical component (e.g., an IC package) and a circuit board (e.g., a PCB) has been known (e.g., see Patent Literature (hereinafter, referred to as PTL) 1).

CITATION LIST

Patent Literature

PTL 1
Japanese Unexamined Patent Application Publication (Translation of PCT Application) No. 2015-507198

SUMMARY OF INVENTION

Technical Problem

Incidentally, this type of socket for electrical connection has been required to relay an electric signal of high frequency (e.g., 10 GHz) due to a recent demand for higher data transfer rate. Thus, a ground-connected metal support is used so as to reduce signal deterioration in the recent electrical connection socket. Further, in the electrical connection socket, signal pins for transmitting a signal are each disposed in a through hole provided so as to communicate between a top surface and a bottom surface of the support, and the signal pin is disposed with an inner peripheral surface of the through hole in between so as to form a coaxial line. In such a socket for electrical connection, the quality of the signal may deteriorate when crosstalk occurs between the signal pins.

An object of the present invention is to provide a socket capable of reducing occurrence of crosstalk between signal pins.

Solution to Problem

One aspect of a socket according to the present invention is a socket electrically connecting between a first electrical component and a second electrical component, and includes: a support in which the first electrical component is disposed on a top side of the support and the second electrical component is disposed on a bottom side thereof; and a signal pin held by the support and electrically connecting to the second electrical component and the first electrical component, wherein the support includes: a body made of a metal, the body holding the signal pin and being connected to a ground; a top plate portion having insulation, the top plate portion being provided above the body and including a top-side first through hole in which a top edge of the signal pin is disposed and a top-side second through hole provided around the top-side first through hole; and a conductive portion formed on an inner peripheral surface of the top-side second through hole and electrically connected to the body when in use.

Advantageous Effects of Invention

According to the present invention, it is possible to provide a socket capable of reducing occurrence of crosstalk between signal pins.

DESCRIPTION OF EMBODIMENTS

Figure 1:
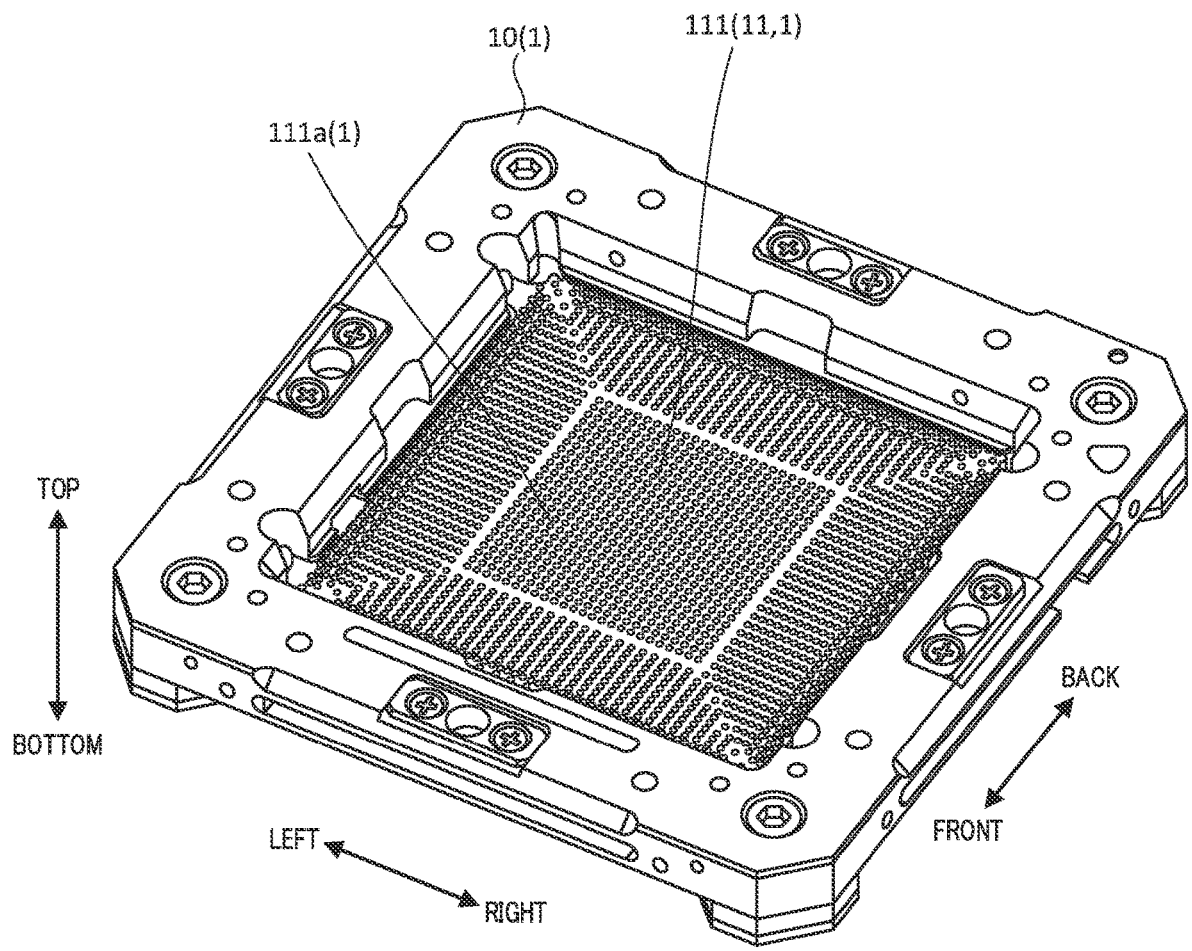
FIG. 1 is a perspective view of a socket according to an embodiment.

Hereinafter, an embodiment of the present invention will be described with reference to the drawings. The same components are denoted by the same reference numerals. In the present specification, a description will be given assuming the directions indicated by arrows marked with words "TOP" and "BOTTOM" in each drawing indicate up or down for convenience. Further, in the present specification, the directions indicated by arrows marked with words "LEFT" and "RIGHT" indicate right or left for convenience. In addition, in the present specification, the directions indicated by arrows marked with words "FRONT" and "BACK" in each drawing indicate front or back for convenience.

Embodiment

Hereinafter, a configuration of socket S according to an embodiment of the present invention will be described with reference to FIGS. 1 to 4.

Figure 2:
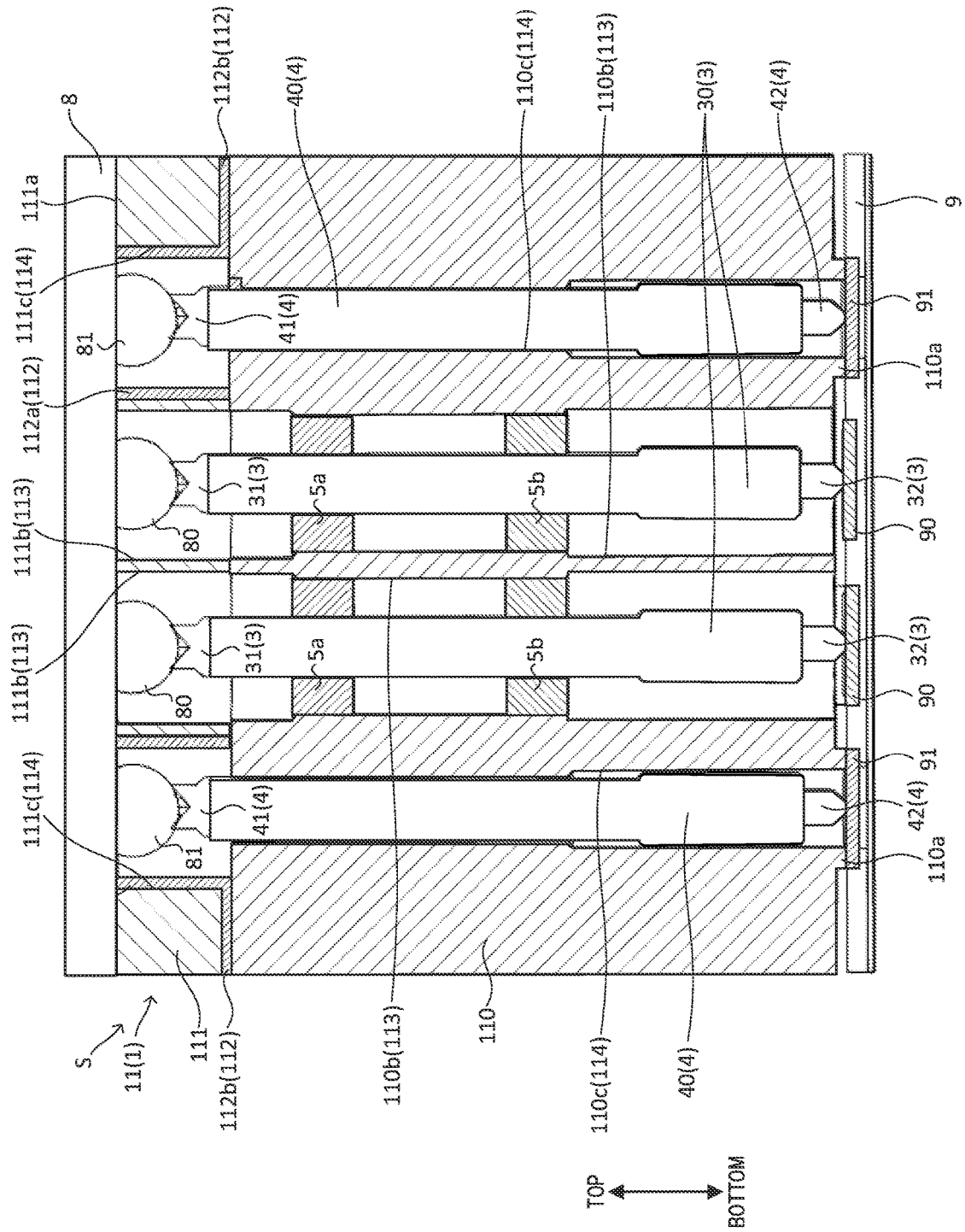
FIG. 2 is a cross-sectional view of the socket according to the embodiment in a use state.
Figure 3:
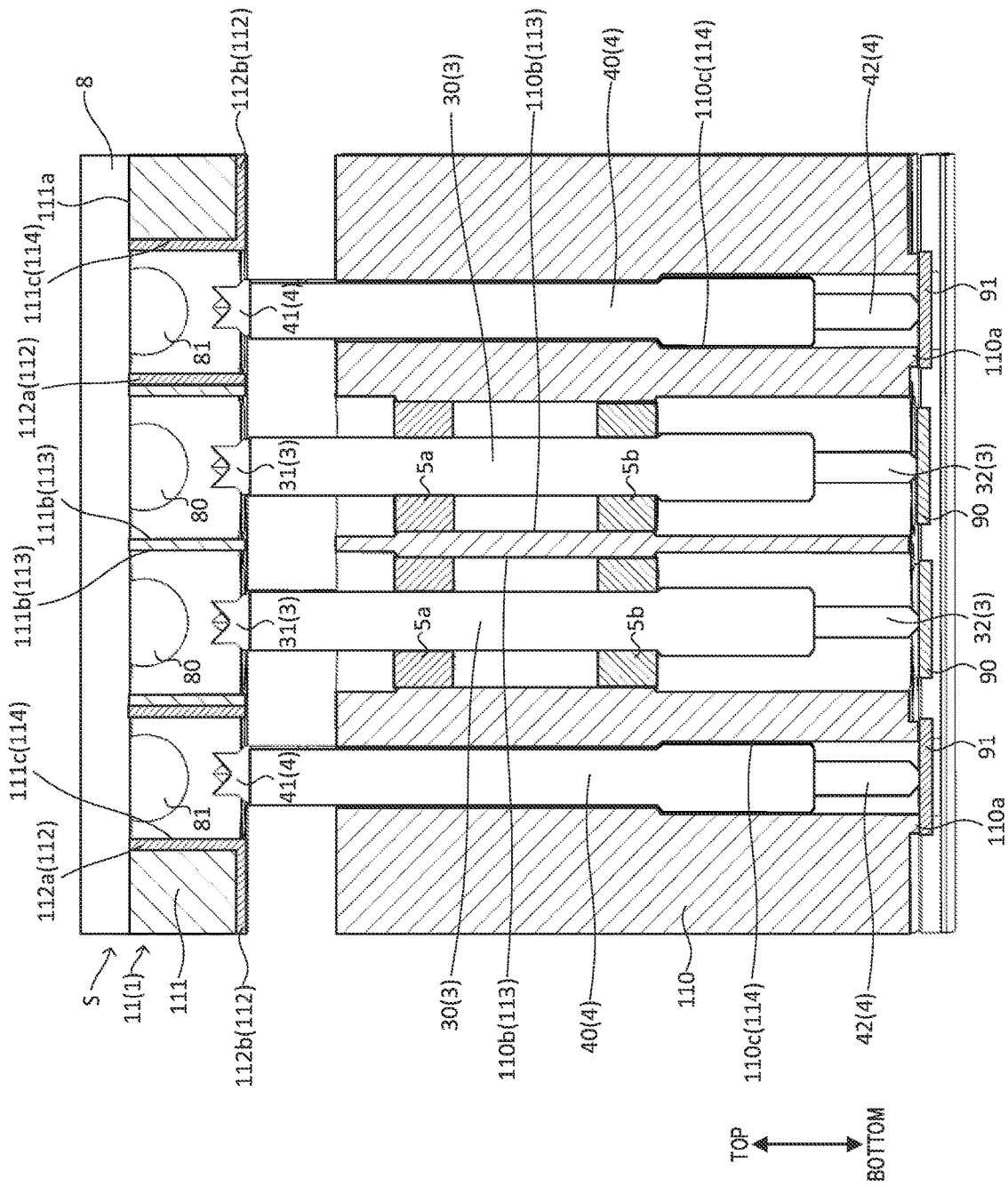
FIG. 3 is a cross-sectional view of the socket according to the embodiment in a non-use state.

FIG. 1 is a perspective view of socket S according to the embodiment. FIG. 2 is a cross-sectional view of socket S according to the embodiment in a use state. FIG. 3 is a cross-sectional view of socket S according to the embodiment in a non-use state.

Socket S is a device for housing IC package 8, which is a member to be inspected, electrically connecting between the housed IC package 8 and circuit board 9, which is an inspection board attached to a bottom side of socket S, and relaying transmission and reception of an electric signal between IC package 8 and circuit board 9. IC package 8 corresponds to an example of the first electrical component, and circuit board 9 corresponds to an example of the second electrical component.

Socket S according to the present embodiment is, for example, a surface-mounted socket and is mounted on circuit board 9. IC package 8 is mounted on the top portion of socket S. Note that, in the following, the side of circuit board 9 as viewed from socket S is described as a bottom side (bottom side in FIG. 2), and the side of IC package 8 is described as a top side (top side in FIG. 2).

Socket S according to the present embodiment is, for example, applied to a performance test of IC package 8. Then, socket S electrically connects between IC package 8 disposed on the side of the top surface of socket S and circuit board 9 disposed on the side of the bottom surface of socket S and being on the side of IC test apparatus.

IC package 8 is, for example, an IC package of a Ball Grid Array (BGA) type. IC package 8 includes signal solder balls 80 (first terminal) for a signal path and ground solder balls 81 (second terminal) for ground connection as terminals for external connection. Signal solder balls 80 and ground solder balls 81 protrude downward from the bottom surface of the package body.

Circuit board 9 is, for example, a Printed Circuit Board (PCB). On circuit board 9, a circuit pattern for a signal path that generates a signal to execute a performance test of IC package 8 and processes reception of a signal from IC package 8, a ground pattern that supplies a ground voltage, and the like are formed. Circuit board 9 is provided in an inspection device.

Further, signal pad electrodes 90 connected to the circuit pattern for a signal path and ground pad electrodes 91 connected to the ground pattern are formed on circuit board 9, while signal pad electrodes 90 and ground pad electrodes 91 being exposed from the surface of circuit board 9.

Note that socket S is mounted on circuit board 9 with bolts, nuts, and/or the like.

Socket S includes socket body 1, signal pins 3 transmitting a signal between circuit board 9 and IC package 8, ground pins 4 supplying a ground voltage from circuit board 9 to IC package 8, and the like.

Socket body 1 includes frame member 10 and support 11.

Frame member 10 is a frame-shaped member having a rectangular outer shape and a through hole passing through in the vertical direction and formed at or near the center thereof.

Support 11 is disposed inside the through hole of frame member 10 and is supported by frame member 10. Support 11 is a member on which IC package 8 is placed when in use. Support 11 includes body 110 made of metal, floating plate 111 having insulation (e.g., made of a resin), and plating portion 112.

Body 110 is formed of, for example, a metal member such as aluminum or copper. Body 110 is, for example, entirely made of aluminum and has conductivity.

Note that body 110 is configured by a top plate (not illustrated) and a bottom plate (not illustrated) connecting with each other, and the top plate and the bottom plater are provided so as to vertically overlap each other with fastening parts (e.g., bolts and nuts). However, body 110 may be integrally configured by one member or may be configured by joining a plurality of plates.

Body 110 includes body-side first through holes 110b into which signal pins 3 are inserted, and body-side second through holes 110c into which ground pins 4 are inserted. That is, signal pins 3 and ground pins 4 are inserted into body 110. The top edges of signal pins 3 and ground pins 4 protrude above the top surface of body 110.

Body-side first through holes 110b and body-side second through holes 110c are both formed so as to communicate from the top surface through the bottom surface of body 110. Note that body-side first through holes 110b and body-side second through holes 110c each have, for example, a circular shape in plan view.

Body 110 includes protrusion portions 110a in the bottom surface around body-side second through holes 110c. Protrusion portions 110a are each in contact with ground pad electrode 91 when socket S is used (see FIG. 2). In this state, body 110 is connected to the ground. Note that protrusion portions 110a of body 110 may be omitted. In this case, body 110 may be connected to the ground by ground pins 4 being in contact with ground pad electrodes 91.

Floating plate 111 corresponds to an example of a top plate portion, and is, for example, a plate-like member made of an insulator such as a synthetic resin and having a rectangular shape in plan view. Floating plate 111 is provided above body 110.

Floating plate 111 includes mounting surface 111a on which IC package 8 is mounted in the central portion of the top surface. Further, floating plate 111 includes floating-side first through holes 111b and floating-side second through holes 111c both penetrating in the vertical direction at positions corresponding to mounting surface 111a.

Floating-side first through hole 111b corresponds to an example of the top-side first through hole, and is a through hole in which the top edge (first edge) of signal pin 3 and signal solder ball 80 of IC package 8 are disposed when socket S is used (see FIG. 2).

Floating-side first through hole 111b is provided on mounting surface 111a at a position corresponding to body-side first through hole 110b of body 110. Therefore, the center axis of floating-side first through hole 111b is the same as the center axis of body-side first through hole 110b of body 110.

Floating-side second through hole 111c corresponds to an example of the top-side second through hole, and is a through hole in which the top edge (first edge) of ground pin 4 and ground solder ball 81 of IC package 8 are disposed when socket S is used (see FIG. 2). In the present embodiment, floating-side second through hole 111c is provided around floating-side first through hole 111b.

Floating-side second through hole 111c is provided on mounting surface 111a at a position corresponding to body-side second through hole 110c of body 110. Therefore, the center axis of floating-side second through hole 111c is the same as the center axis of body-side second through hole 110c of body 110.

Body-side first through hole 110b and floating-side first through hole 111b constitute signal through hole 113.

Body-side second through hole 110c and floating-side second through hole 111c constitute ground through hole 114.

Floating plate 111 is supported in a vertically movable state by body 110 via a support mechanism (not illustrated). Floating plate 111 is constantly biased upward by a biasing mechanism (e.g., a coil spring, not illustrated). A stroke of floating plate 111 in the vertical direction is restricted to a predetermined distance.

When socket S is in the use state (see FIG. 2), floating plate 111 is located at the bottom limit of the stroke. When socket S is in the use state, IC package 8 and floating plate 111 are pressed downward by a pressing member provided in the inspection device. In a state where floating plate 111 is located at the bottom limit of the stroke, the bottom surface of floating plate 111 is in contact with the top surface of body 110.

When socket S is in the non-use state (see FIG. 3), floating plate 111 is located at the top limit of the stroke.

In a state where floating plate 111 is located at the top limit of the stroke, the bottom surface of floating plate 111 is separated from the top surface of body 110. That is, a gap in the vertical direction exists between the bottom surface of floating plate 111 and the top surface of body 110 in the state where floating plate 111 is located at the top limit of the stroke.

Plating portion 112 is provided on floating plate 111. Plating portion 112 is formed of a conductive metal film. Plating portion 112 includes inner-peripheral-side plating portion 112a and bottom-side plating portion 112b.

Inner-peripheral-side plating portion 112a corresponds to an example of a conductive film, and is provided on an inner peripheral surface of floating-side second through hole 111c in floating plate 111. Inner-peripheral-side plating portion 112a surrounds the top edge of ground pin 4 and ground solder ball 81 of IC package 8 when socket S is used (see FIG. 2).

In the present embodiment, inner-peripheral-side plating portion 112a is provided on the inner peripheral surfaces of all floating-side second through holes 111c. Further, in the present embodiment, inner-peripheral-side plating portion 112a is provided on the entire inner peripheral surface of each floating-side second through hole 111c.

However, the inner-peripheral-side plating portion may be provided on a portion of the inner peripheral surface of floating-side second through hole 111c. In this case, it is preferred that the inner-peripheral-side plating portion be provided on a portion of the inner peripheral surface of floating-side second through hole 111c which is located in the vicinity of the adjacent floating-side first through hole 111b.

Bottom-side plating portion 112b corresponds to an example of the bottom-surface-side conductive film, and is provided on the bottom surface of floating plate 111. Bottom-side plating portion 112b is connected to inner-peripheral-side plating portion 112a. Bottom-side plating portion 112b is in contact with the top surface of body 110 when socket S is in the use state (see FIG. 2).

In this state, bottom-side plating portion 112b electrically connects between inner-peripheral-side plating portion 112a and body 110. As described above, body 110 is connected to the ground. Thus, when socket S (see FIG. 2) is in the use state, inner-peripheral-side plating portion 112a is also connected to the ground. Note that the electrical connection between inner-peripheral-side plating portion 112a and body 110 when socket S is in the use state is not necessarily caused by the contact between bottom-side plating portion 112b and the top surface of body 110. For example, in such a case where an insulator is present between bottom-side plating portion 112b and the top surface of body 110, a means for conducting inner-peripheral-side plating portion 112a or bottom-side plating portion 112b and body 110 with each other may be separately provided.

Bottom-side plating portion 112b may not be provided on the entire surface of the bottom surface of floating plate 111. Bottom-side plating portion 112b may be provided in a predetermined area on the bottom surface of floating plate 111. It is preferred that bottom-side plating portion 112b be not provided around floating-side first through hole 111b in terms of reducing a short-circuit of signal pin 3.

Incidentally, plating portion 112 is not provided on the top surface of floating plate 111 in the present embodiment. Thus, a synthetic resin forming floating plate 111 is exposed on the top surface of floating plate 111. This can suppress the damage of the bottom surface of IC package 8 due to the contact between the bottom surface of IC package 8 and the top surface of floating plate 111 in the present embodiment.

Signal pins 3 are each held by signal through hole 113 of support 11. Signal pin 3 is provided in signal through hole 113 so as to be separated from the inner peripheral surface of signal through hole 113.

That is, signal pins 3 are disposed in signal through holes 113 while being electrically insulated from support 11 (specifically, body 110), and each form a coaxial line between signal pin 3 and the inner peripheral surface of signal through hole 113.

Note that the distance between the outer peripheral surface of signal pin 3 (pin barrel 30) and the inner peripheral surface of signal through hole 113 (specifically, body-side first through hole 110b) is adjusted so that the characteristic impedance of the coaxial line that signal pin 3 forms is a predetermined value at each position (e.g., 50Ω).

Signal pin 3 provides an impedance-matched signal path between IC package 8 and circuit board 9 by such a configuration.

Each signal pin 3 as described above includes pin barrel 30, first plunger 31, and second plunger 32.

Pin barrel 30 is a cylindrical member and is disposed in signal through hole 113 so as to extend in the vertical direction along signal through hole 113. Pin barrel 30 is fixed to signal through hole 113 (specifically, body-side first through hole 110b) in a state of being separated from the inner peripheral surface of signal through hole 113 (specifically, body-side first through hole 110b) by holding members 5a and 5b having insulation.

First plunger 31 and second plunger 32 are disposed inside pin barrel 30. First plunger 31 and second plunger 32 are biased in a direction away from each other by a coil spring (not illustrated) provided between first plunger 31 and second plunger 32.

The top edge of first plunger 31 constitutes the top edge of signal pin 3, and protrudes upward from the opening formed in the top edge of pin barrel 30. Further, the top edge of first plunger 31 protrudes above the top surface of body 110.

On the other hand, the top edge of first plunger 31 does not protrude above the top surface of floating plate 111. The top edge of first plunger 31 is disposed in floating-side first through hole 111b of floating plate 111 when socket S is in the use state.

By the above-described configuration, the top edges of first plungers 31 come into contact with signal solder balls 80 of IC package 8 when IC package 8 is mounted on socket S. This allows signal pins 3 and the signal path in IC package 8 to be electrically connected with each other.

The bottom edge of each second plunger 32 constitutes the bottom edge of signal pin 3, and protrudes downward from the opening formed in the bottom edge of pin barrel 30. Further, the bottom edge of each second plunger 32 protrudes below the bottom surface of body 110.

By the above-described configuration, the bottom edges of second plungers 32 come into contact with signal pad electrodes 90 of circuit board 9 when socket S is mounted on circuit board 9. This allows signal pins 3 and the signal path in circuit board 9 to be electrically connected with each other.

Note that a spring (not illustrated) provided between first plunger 31 and second plunger 32 biases first plunger 31 upward and biases second plunger 32 downward.

This ensures contact pressure between the top edge of first plunger 31 and signal solder ball 80 of IC package 8 and contact pressure between the bottom edge of second plunger 32 and signal pad electrode 90 of circuit board 9.

Signal pins 3 of the above-described configuration relay signal transmission between IC package 8 and circuit board 9 when the top edges of first plungers 31 are in contact with signal solder balls 80 of IC package 8 and the bottom edges of second plungers 32 are in contact with signal pad electrodes 90 of circuit board 9.

Ground pins 4 are each held by ground through hole 114 of support 11. Ground pin 4 (pin barrel 40) is provided so as to be in contact with the inner peripheral surface of ground through hole 114 (body-side second through hole 110c) in ground through hole 114 (body-side second through hole 110c).

That is, ground pin 4 is disposed in ground through hole 114 (body-side second through hole 110*c*) in a state of being electrically connected with body 110 in the inner peripheral surface of ground through hole 114 (body-side second through hole 110*c*).

Similarly to signal pin 3, ground pin 4 includes pin barrel 40, first plunger 41 and second plunger 42.

Ground pins 4 are each configured by substantially the same structure as signal pins 3. That is, when IC package 8 is mounted on socket S, the top edges of first plungers 41 come into contact with ground solder balls 81 of IC package 8 and the bottom edges of second plungers 42 come into contact with ground pad electrodes 91 of circuit board 9.

This supplies the ground voltage of circuit board 9 to the ground pattern of IC package 8 via ground pins 4.

Next, a use state of socket S according to the present embodiment will be described.

First, socket S is mounted on circuit board 9. At this time, protrusion portions 110*a* provided in the bottom surface of body 110 come into contact with ground pad electrodes 91 of circuit board 9. Thus, body 110 is electrically connected to ground pad electrodes 91 of circuit board 9, thus, making a state where a stable ground voltage is secured. Note that protrusion portions 110*a* of body 110 may be omitted. In this case, body 110 may be connected to the ground by ground pins 4 being in contact with ground pad electrodes 91.

Next, IC package 8 is mounted on socket S. Then, the top surface of IC package 8 is pressed downward by the pressing member provided in the inspection device, and signal solder balls 80 and ground solder balls 81 of IC package 8 come into contact with the top edges of signal pins 3 and ground pins 4 (first plungers 31 and 41), respectively.

This allows electrical contact between signal solder balls 80 and first plungers 31 of signal pins 3, and electrical contact between ground solder balls 81 and first plungers 41 of ground pins 4.

Then, as IC package 8 descends, second plungers 32 of signal pins 3 and second plungers 42 of ground pins 4 come into contact with signal pad electrodes 90 and ground pad electrodes 91 on circuit board 9, respectively. This allows electrical contact between signal pad electrodes 90 and second plungers 32 of signal pins 3, and electrical contact between ground pad electrodes 91 and second plungers 42 of ground pins 4.

At this time, a biasing force of a spring (not illustrated) is applied to each of first plunger 31 and second plunger 32 of each signal pin 3 in a direction away from each other along the vertical direction.

Similarly, a biasing force of a spring (not illustrated) is applied to each of first plunger 41 and second plunger 42 of each ground pin 4 in a direction away from each other along the vertical direction.

As a result, a state is maintained in which contact pressure is appropriately secured between signal solder balls 80 and ground solder balls 81 of IC package 8 and first plungers 31 of signal pins 3 and first plungers 41 of ground pins 4 while contact pressure is appropriately secured between signal pad electrodes 90 and ground pad electrodes 91 of circuit board 9 and second plungers 32 of signal pins 3 and second plungers 42 of ground pins 4.

As described above, IC package 8 and circuit board 9 are electrically connected with each other via socket S, so that a performance test of IC package 8 is executed. At this time, signal transmission via signal pins 3 is performed while signal deterioration is suppressed due to the ground voltage of body 110 maintained in a stable state.

In particular, socket S of the present embodiment includes inner-peripheral-side plating portions 112*a* provided on the inner peripheral surfaces of floating-side second through holes 111*c*. Thus, crosstalk between signal pins 3 arranged adjacent to each other can be reduced. Hereinafter, the reason why crosstalk between signal pins 3 can be reduced will be described with reference to FIG. 4.

Figure 4:
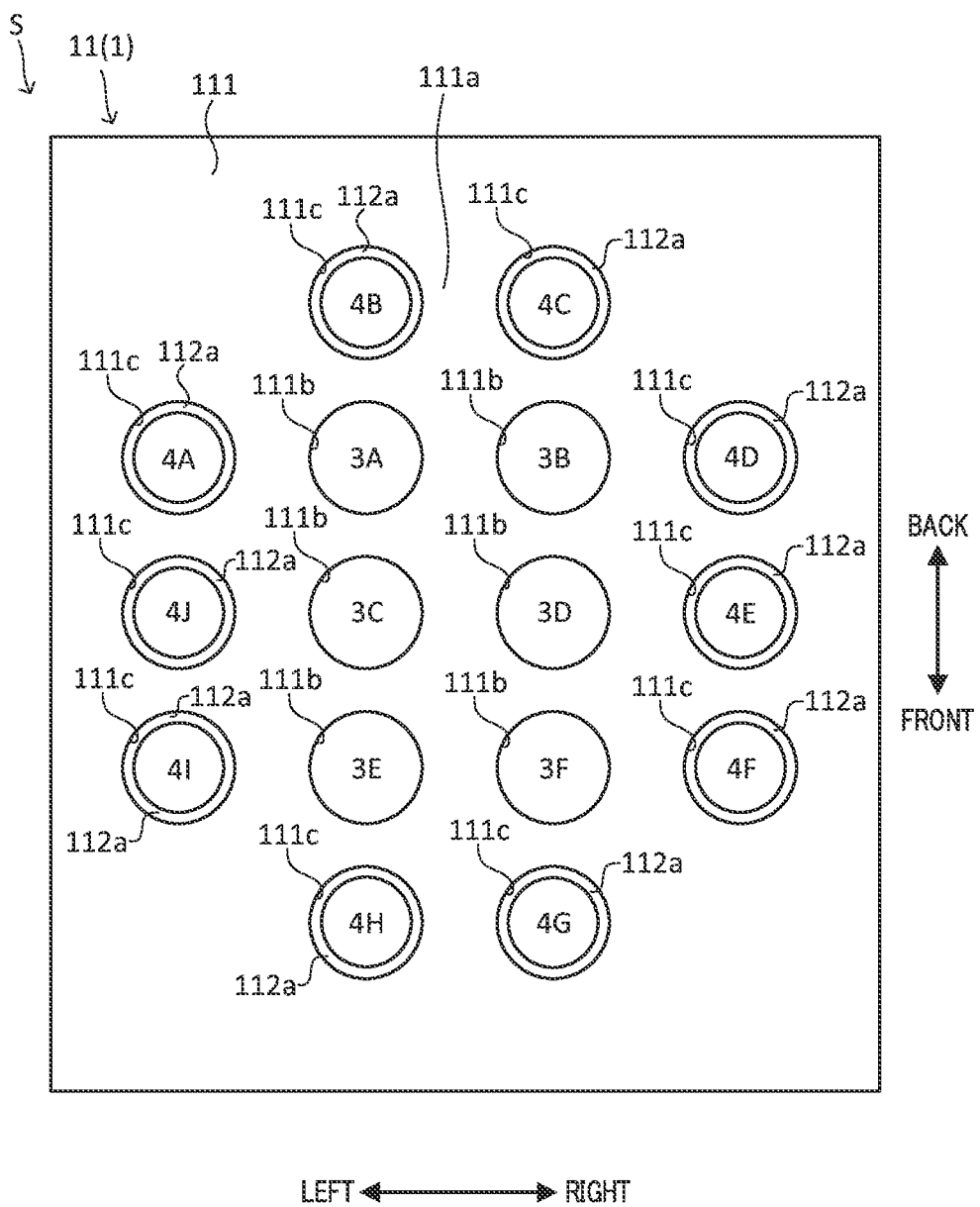
FIG. 4 is a schematic plan view of the socket according to the embodiment.

In FIG. 4, six signal pins 3A to 3F and ten ground pins 4A to 4J are illustrated. Note that the arrangement of signal pins 3A to 3F and ground pins 4A to 4J illustrated in FIG. 4 is an exemplary arrangement of the signal pins and the ground pins.

In FIG. 4, signal pin 3A and signal pin 3B are adjacent to each other in the right and left direction. As illustrated in FIG. 2, a portion of signal pin 3A other than the top edge and a portion of signal pin 3B other than the top edge are partitioned by a portion of body 110 connected to the ground. Thus, crosstalk between the portion of signal pin 3A other than the top edge and the portion of signal pin 3B other than the top edge are reduced by body 110.

Meanwhile, the top edge of signal pin 3A and the top edge of signal pin 3B are partitioned by a portion of floating plate 111. However, because floating plate 111 is made of a synthetic resin, so-called capacitive coupling or inductive coupling (hereinafter, simply referred to as "coupling") occurs between the top edge of signal pin 3A and the top edge of signal pin 3B, and crosstalk may occur.

Then, in the present embodiment, inner-peripheral-side plating portions 112*a* are provided on the inner peripheral surfaces of floating-side second through holes 111*c* in floating plate 111. As described above, inner-peripheral-side plating portions 112*a* are connected to the ground when socket S is in the use state (see FIG. 2).

Specifically, as illustrated in FIG. 4, inner-peripheral-side plating portions 112*a* corresponding to ground pins 4A and 4B are provided around signal pin 3A. Further, inner-peripheral-side plating portions 112*a* corresponding to ground pins 4C and 4D are provided around signal pin 3B.

When inner-peripheral-side plating portions 112*a* connected to the ground (that is, the ground) are present in the vicinity of signal pins 3A and 3B as described above, signal pins 3A and 3B are coupled to inner-peripheral-side plating portions 112*a* arranged in the vicinity; therefore, signal pins 3A and 3B are less likely to be coupled to each other. As a result, the coupling of signal pins 3A and 3B to each other is reduced, and the crosstalk between signal pins 3A and 3B is reduced.

Other Embodiments

The present invention is not limited to the above-described embodiment, and various modifications are conceivable.

In the above embodiment, a state in which signal pins 3 are held so as to be separated from the inner wall surfaces of signal through holes 113 has been described as an example of the holding state of signal pins 3. However, it is sufficient as long as signal pins 3 are electrically insulated from body 110, so that a configuration may be employed in which an insulating member is interposed between signal pin 3 and the inner peripheral surface of signal through hole 113.

Further, in the above embodiment, IC package 8 is described as an example of an electrical component connected to the top side of socket S. However, the electrical component connected to the top side of socket S may be a coaxial cable or the like.

Furthermore, in the above embodiment, a state in which socket S is used for testing IC package 8 has been described as an example of the use of socket S. However, socket S may be applied to any electrical connection other than testing IC package 8.

Moreover, in the above embodiment, an aspect in which socket S includes ground pins 4 has been described as an example of the configuration of socket S. However, socket S may be configured without ground pins 4 in consideration of the case where protrusion portions 110a connect body 110 to the ground. In this case, no pin may be inserted into the second through hole. Further, in the case of the configuration without ground pins 4, body-side second through holes 110c of body 110 may be omitted.

In addition, in the above-described embodiment, an aspect in which floating plate 111 configured to be movable with respect to body 110 is used has been described as an example of a top plate portion. However, the top plate portion may be configured to be immovable with respect to body 110.

Specific examples of the present disclosure have been described thus far, but these examples are only exemplary, and are not to limit the claims. Techniques recited in the claims include, for example, variations and/or modifications of the specific examples exemplified above.

INDUSTRIAL APPLICABILITY

According to the socket for electrical connection according to the present disclosure, it is possible to stabilize the ground voltage of a metal casing and reduce signal deterioration at the time of signal transmission.

REFERENCE SIGNS LIST

S Socket
1 Socket body
10 Frame member
11 Support
110 Body
110a Protrusion portion
110b Body-side first through hole
110c Body-side second through hole
111 Floating plate
111a Mounting surface
111b Floating-side first through hole
111c Floating-side second through hole
112 Plating portion
112a Inner-peripheral-side plating portion
112b Bottom-side plating portion
113 Signal through hole
114 Ground through hole
3, 3A to 3F Signal pin
30 Pin barrel
31 First plunger
32 Second plunger
4, 4A to 4J Ground pin
40 Pin barrel
41 First plunger
42 Second plunger
5b Holding member
8 IC Package
80 Signal solder ball
81 Ground solder ball
9 Circuit board
90 Signal pad electrode
91 Ground pad electrode

The invention claimed is:

1. A socket electrically connecting between a first electrical component and a second electrical component, the socket comprising:
   a support in which the first electrical component is disposed on a top side of the support and the second electrical component is disposed on a bottom side thereof; and
   a signal pin held by the support and electrically connecting to the second electrical component and the first electrical component, wherein
   the support includes:
      a body made of a metal, the body holding the signal pin and being connected to a ground;
      a top plate portion having insulation, the top plate portion being provided above the body and including a top-side first through hole in which a top edge of the signal pin is disposed and a top-side second through hole provided around the top-side first through hole; and
      a conductive portion formed on an inner peripheral surface of the top-side second through hole and electrically connected to the body when in use.

2. The socket according to claim 1 further comprising a ground pin held by the body, the ground pin including top edge thereof disposed in the top-side second through hole, the ground pin being electrically connected to the second electrical component and the first electrical component.

3. The socket according to claim 1, wherein
the top plate portion is a floating plate vertically movable with respect to the body between a top edge position and a bottom edge position.

4. The socket according to claim 1, wherein
the support includes a bottom-side conductive portion provided on a bottom surface of the top plate portion and electrically connecting between the conductive portion and the body.

* * * * *